United States Patent
Yang et al.

(10) Patent No.: US 10,074,695 B2
(45) Date of Patent: Sep. 11, 2018

(54) NEGATIVE DIFFERENTIAL RESISTANCE (NDR) DEVICE BASED ON FAST DIFFUSIVE METAL ATOMS

(71) Applicant: HEWLETT PACKARD ENTERPRISE DEVELOPMENT LP, Houston, TX (US)

(72) Inventors: Jianhua Yang, Palo Alto, CA (US); Stanley Williams, Palo Alto, CA (US); Max Zhang, Palo Alto, CA (US); Zhiyong Li, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/500,084

(22) PCT Filed: Dec. 19, 2014

(86) PCT No.: PCT/US2014/071345
§ 371 (c)(1),
(2) Date: Jan. 30, 2017

(87) PCT Pub. No.: WO2016/099525
PCT Pub. Date: Jun. 23, 2016

(65) Prior Publication Data
US 2017/0243924 A1    Aug. 24, 2017

(51) Int. Cl.
*H01L 47/00* (2006.01)
*H01L 27/26* (2006.01)

(52) U.S. Cl.
CPC ............ *H01L 27/26* (2013.01); *H01L 47/005* (2013.01)

(58) Field of Classification Search
CPC ............................... H01L 27/26; H01L 47/005
USPC .............................................................. 257/4
See application file for complete search history.

(56) References Cited

U.S. PATENT DOCUMENTS

| | | | |
|---|---|---|---|
| 5,401,981 A | 3/1995 | Michael et al. | |
| 8,212,621 B2 | 7/2012 | Strachan et al. | |
| 9,633,724 B2 * | 4/2017 | Jo | G11C 29/026 |
| 2004/0110324 A1 | 6/2004 | King | |
| 2004/0197947 A1 | 10/2004 | Fricke et al. | |
| 2007/0080345 A1 | 4/2007 | Joo et al. | |
| 2011/0037558 A1 | 2/2011 | Campbell | |
| 2011/0227022 A1 * | 9/2011 | Cho | B82Y 10/00 257/3 |
| 2011/0240941 A1 | 10/2011 | Pickett et al. | |
| 2012/0105159 A1 | 5/2012 | Strachan et al. | |

(Continued)

FOREIGN PATENT DOCUMENTS

WO    WO-2003073513 A1    9/2003

OTHER PUBLICATIONS

International Searching Authority, The International Search Report and the Written Opinion, dated Sep. 18, 2015, 13 Pages.

(Continued)

*Primary Examiner* — Tu-Tu Ho
(74) *Attorney, Agent, or Firm* — Fabian VanCott

(57) ABSTRACT

A negative differential resistance (NDR) device for non-volatile memory cells in crossbar arrays is provided. Each non-volatile memory cell is situated at a crosspoint of the array. Each non-volatile memory cell comprises a switching layer in series with an NDR material containing fast diffusive atoms that are electrochemically inactive. The switching layer is positioned between two elec-trodes.

17 Claims, 4 Drawing Sheets

(56) References Cited

U.S. PATENT DOCUMENTS

| | | |
|---|---|---|
| 2013/0099187 A1 | 4/2013 | Pickett et al. |
| 2013/0242637 A1 | 9/2013 | Yang et al. |
| 2014/0003139 A1 | 1/2014 | Pickett et al. |
| 2016/0005461 A1* | 1/2016 | Jo .................. G11C 29/026 365/148 |
| 2017/0141160 A1* | 5/2017 | Zhang ............... H01L 27/2463 |

OTHER PUBLICATIONS

Yang, J.J. et al., Memristive Devices for Computing, Dec. 27, 2012, Nature Nanotechnology, vol. 8, pp. 13-24.
EP Search Report cited in Appl. No. 14908603.5 dated Nov. 27, 2017; 7 pages.

* cited by examiner

NEGATIVE DIFFERENTIAL RESISTANCE (NDR) DEVICE BASED ON FAST DIFFUSIVE METAL ATOMS

BACKGROUND

Non-volatile memory is computer memory that can get back stored information even when not powered. Types of non-volatile memory may include resistive RAM (random access memory) (RRAM or ReRAM), phase change RAM (PCRAM), conductive bridge RAM (CBRAM), ferroelectric RAM (F-RAM), etc.

Resistance memory elements, such as resistive RAM, or ReRAM, can be programmed to different resistance states by applying programming energy. After programming, the state of the resistive memory elements can be read and remains stable over a specified time period. Large arrays of resistive memory elements can be used to create a variety of resistive memory devices, including non-volatile solid state memory, programmable logic, signal processing, control systems, pattern recognition devices, and other applications. Examples of resistive memory devices include valence change memory and electrochemical metallization memory, both of which involve ionic motion during electrical switching and belong to the category of memristors.

Memristors are devices that can be programmed to different resistive states by applying a programming energy, for example, a voltage or current pulse. This energy generates a combination of electric field and thermal effects that can modulate the conductivity of both non-volatile switch and non-linear select functions in a memristive element. After programming, the state of the memristor can be read and remains stable over a specified time period.

DETAILED DESCRIPTION

Figure 1:
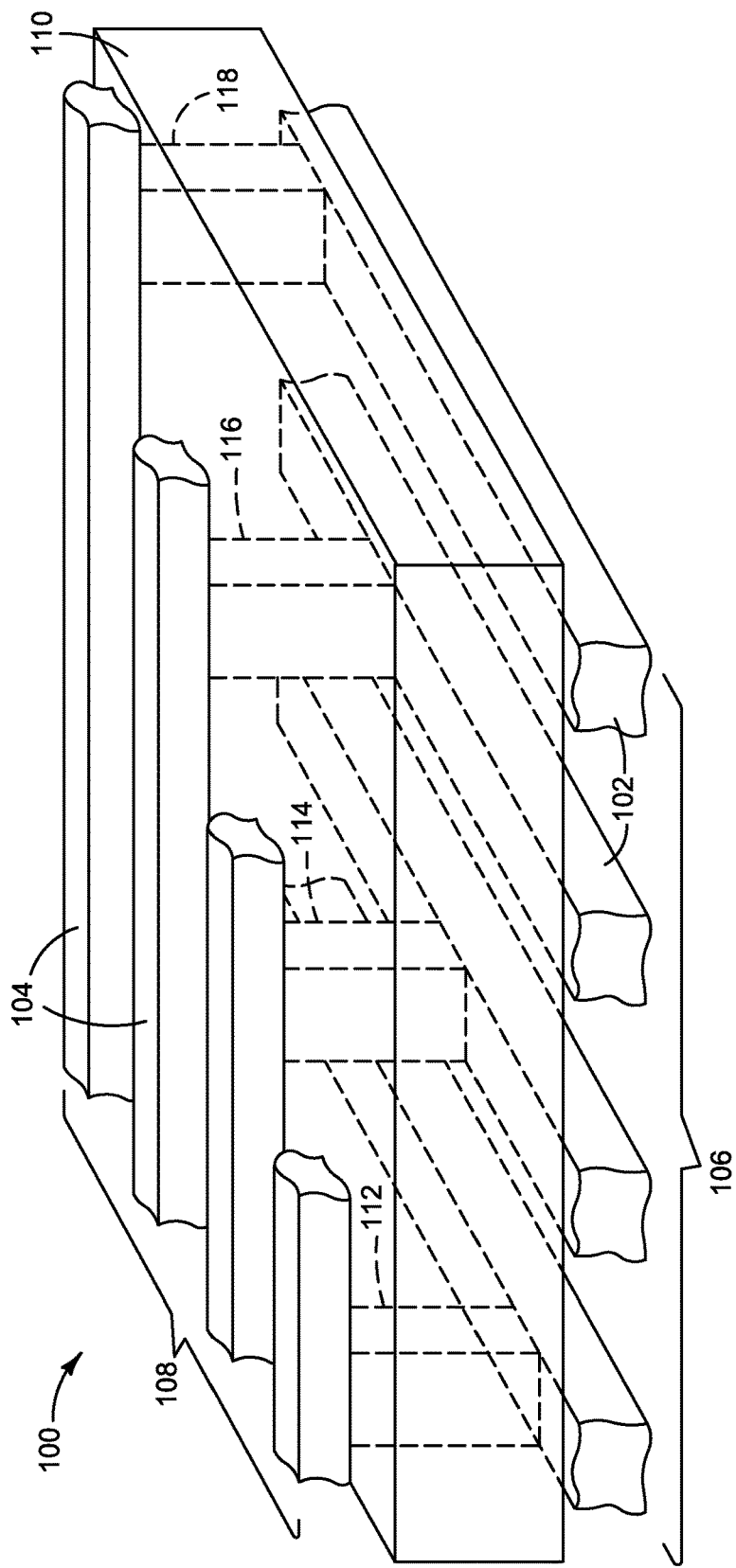
FIG. 1 is a perspective view of a crossbar memory array, according to an example.

It may be appreciated that, in the following description, numerous specific details are set forth to provide a thorough understanding of the examples. However, it is appreciated that the examples may be practiced without limitation to these specific details. In other instances, well-known methods and structures may not be described in detail to avoid unnecessarily obscuring the description of the examples. Also, the examples may be used in combination with each other.

While a limited number of examples have been disclosed, it should be understood that there are numerous modifications and variations therefrom. Similar or equal elements in the Figures may be indicated using the same numeral.

It is to be noted that, as used in this specification and the appended claims, the singular forms "a," "an," and "the" include plural referents unless the context clearly dictates otherwise.

Memristors are nano-scale devices that may be used as a component in a wide range of electronic circuits, such as memories, switches, radio frequency circuits, and logic circuits and systems. In a memory structure, a crossbar array of memristor devices may be used. When used as a basis for memories, memristors may be used to store bits of information, 1 or 0. When used as a logic circuit, a memristor may be employed as configuration bits and switches in a logic circuit that resembles a Field Programmable Gate Array, or may be the basis for a wired-logic Programmable Logic Array. It is also possible to use memristors capable of multi-state or analog behavior for these and other applications.

The resistance of a memristor may be changed by applying a voltage across or a current through the memristor. Generally, at least one channel may be formed that is capable of being switched between two states—one in which the channel forms an electrically conductive path ("ON") and one in which the channel forms a less conductive path ("OFF"). In some cases, conducting channels may be formed by ions and/or vacancies. Some memristors exhibit bipolar switching, where applying a voltage of one polarity may switch the state of the memristor and where applying a voltage of the opposite polarity may switch back to the original state. Alternatively, memristors may exhibit unipolar switching, where switching is performed, for example, by applying different voltages of the same polarity.

Using memristors in crossbar arrays may lead to read and/or write failure due to sneak currents passing through the cells that are not selected—for example, cells on the same row or column as a targeted cell. Failure may arise when the total current from an applied voltage is higher than the current through the targeted memristor due to current sneaking through untargeted neighboring cells. As a result, effort has been spent on minimizing sneak currents. Using a transistor with each memristor has been proposed to isolate each cell and overcome the sneak current. However, using a transistor with each memristor in a crossbar array limits array density and increases cost, which may impact the commercialization of memristor devices.

When used as a switch, the memristor may either be in a low resistance (closed) or high resistance (open) state in a crosspoint memory. During the last few years, researchers have made great progress in finding ways to make the switching function of these memristors behave efficiently. For example, tantalum oxide ($TaO_x$)-based memristors have been demonstrated to have superior endurance over other nano-scale devices capable of electronic switching. In lab settings, tantalum oxide-based memristors are capable of over 10 billion switching cycles.

A memristor may be a switching material, such as $TiO_x$ or $TaO_x$, sandwiched between two electrodes. Memristive behavior is achieved by the movement of ionic species (e.g., oxygen ions or vacancies) within the switching material to create localized changes in conductivity via modulation of a conductive filament between two electrodes, which results in a low resistance "ON" state, a high resistance "OFF" state, or intermediate states. Initially, when the memristor is first fabricated, the entire switching material may be non-conductive. As such, a forming process may be required to form the conductive channel in the switching material between the two electrodes. A known forming process, often called "electroforming", includes applying a sufficiently high (threshold) voltage across the electrodes for a sufficient length of time to cause a nucleation and formation of a localized conductive channel (or active region) in the switching material. The threshold voltage and the length of time required for the forming process may depend upon the type of material used for the switching material, the first electrode, and the second electrode, and the device geometry.

Metal or semiconductor oxides may be employed in memristive devices; examples include either transition metal oxides, such as tantalum oxide, titanium oxide, yttrium oxide, hafnium oxide, niobium oxide, zirconium oxide, or other like oxides, or non-transition metal oxides, such as aluminum oxide, calcium oxide, magnesium oxide, dysprosium oxide, lanthanum oxide, silicon dioxide, or other like oxides. Further examples include transition metal nitrides, such as aluminum nitride, gallium nitride, tantalum nitride, and silicon nitride.

Negative differential resistance (NDR) is a very attractive property with many possible applications, including as a selector in a memristor crossbar or the key component in neuristors. The most common thin film NDR devices utilize insulator-metal-transition (IMT) materials that switch based on joule heat and are power hungry.

In accordance with the teachings herein, a new type of NDR device is provided based on motion of fast diffusive atoms, such as Au, under electrical bias. When the bias is above a certain threshold voltage, the metal/Au doped insulator/metal stack becomes very conductive. The switching is voltage-driven and the stack becomes very resistive again as long as the voltage is removed.

As used herein, a "fast diffusive" atom is one that, in the absence of an electric field, can diffuse faster than an oxygen vacancy, a nitrogen vacancy, an oxygen anion, etc. Further, such fast diffusive atoms may not be electrochemically active (i.e., may be electrochemically inactive). According to the Einstein relation, the drift (in the presence of an electric field) is also faster for the "fast diffusive" atoms. Examples of such atoms include, but are not limited, to gold, platinum, and palladium. In some examples, gold may be used.

FIG. 1 illustrates a perspective view of a memory array, or crossbar, 100 that includes a NDR device based on fast diffusive metal atoms, according to an example. FIG. 1 reveals an intermediate layer 110 disposed between a first, or bottom, layer 106 of approximately parallel conductors 102 and a second, or top, layer 108 of approximately parallel conductors 104. The first layer of conductors may be at a non-zero angle relative to the second layer of conductors to form crosspoints or intersections.

According to one illustrative example, the intermediate layer 110 may be a dielectric layer, such as an insulating layer. A number of resistance memory devices 112-118 may be formed at the intersections, or junctions, between conductors 102 in the bottom layer 106 and conductors 104 in the top layer 108. The conductors 102, 104 may serve as the bottom and top electrodes. For example, when forming a non-volatile memory device, such as a resistance memory device, the conductors 102 in the bottom layer 106 may be formed from a conductive material, such as tungsten, copper, aluminum, or the like, and the conductors 104 in the top layer 108 may be formed from the conductive material, which may be the same or different as the bottom layer 106.

Figure 4A:
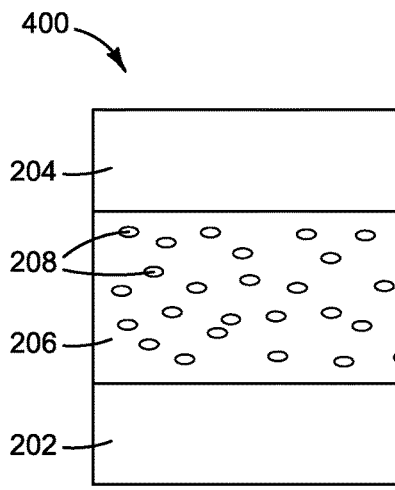
FIGS. 4A-4B are each cross-sectional views of an OFF state (FIG. 3A) and an ON state (under electrical bias) (FIG. 3B), according to an example.
Figure 4B:
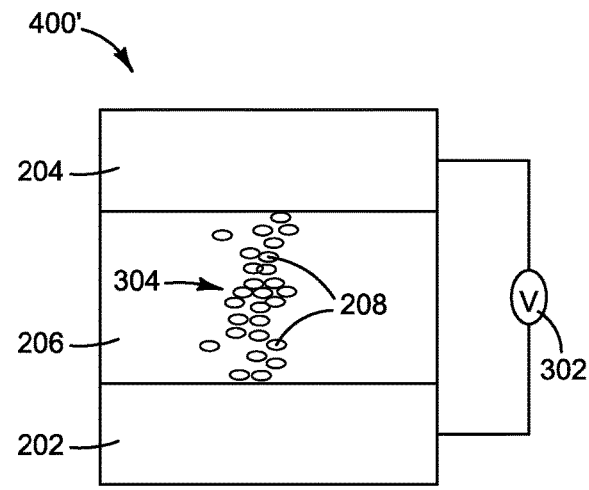

To avoid complicating FIG. 1, the individual layers of the resistance memory devices 112-118 are not shown. However, FIGS. 2A-2C, described below, provides more structural detail of the resistance memory devices 112-118 with the protective resistor in series therewith. FIGS. 4A-4B provide an example of the operation of the structures.

For purposes of illustration, only a few of the resistance memory devices 112-118 are shown in FIG. 1. Each of the devices 112-118 may be used to represent one or more bits of data. For example, in the simplest case, a resistance memory device may have two states: a low resistance state and a high resistance state. The low resistance state may represent a binary "1" and the high resistance state may represent a binary "0", or vice versa. Binary data may be written into the nanowire memory array 100 by changing the resistance state of the matrix within the resistive memory devices. The binary data can then be retrieved by sensing the resistance state of the resistive memory devices 112-118. Such writing and sensing may be done using appropriate circuitry (not shown).

According to certain illustrative examples, the programmable crosspoint devices 112-118 may be memristive devices. Memristive devices exhibit a "memory" of past electrical conditions. For example, a memristive device may include a matrix material that contains mobile dopants. These dopants can be moved within a matrix to dynamically alter the electrical operation of an electrical device, such as the resistance of that device.

The motion of dopants can be induced by the application of a programming condition such as an applied electrical voltage across a suitable matrix. The programming voltage generates a relatively high electric field through the memristive matrix and alters the distribution of dopants. After removal of the electric field, the location and characteristics of the dopants remain stable until the application of another programming electrical field.

As indicated, by changing the dopant configurations within a memristive matrix, the electrical resistance of the device may be altered. The memristive device is then read by applying a lower reading voltage which allows the internal electrical resistance of the memristive device to be sensed but does not generate a high enough electric field to cause significant dopant motion. Consequently, the state of the memristive device may remain stable over long time periods and through multiple read cycles.

According to certain illustrative examples, the crossbar memory array 100 may be used to form a non-volatile memory array. Non-volatile memory has the characteristic of not losing its contents when no power is being supplied. Each of the programmable crosspoint devices 112-118 is used to represent one or more bits of data. Although individual crossbar lines 102, 104 in FIG. 1 are shown with rectangular cross sections, crossbars may also have square, circular, elliptical, or more complex cross sections, such as trapezoid. The lines may also have many different widths, diameters, aspect ratios and/or eccentricities. The crossbars may be nanowires, sub-microscale wires, microscale wires, or wires with larger dimensions.

According to certain illustrative examples, the crossbar memory array 100 may be integrated into a Complimentary Metal-Oxide-Semiconductor (CMOS) circuit or other conventional computer circuitry. Each individual wire segment may be connected to the CMOS circuitry by a via (not shown). The via may be embodied as an electrically conductive path through the various substrate materials used in manufacturing the crossbar architecture. This CMOS circuitry can provide additional functionality to the memristive device such as input/output functions, buffering, logic, configuration, or other functionality. Multiple crossbar arrays can be formed over the CMOS circuitry to create a multi-layer circuit.

Figure 2A:
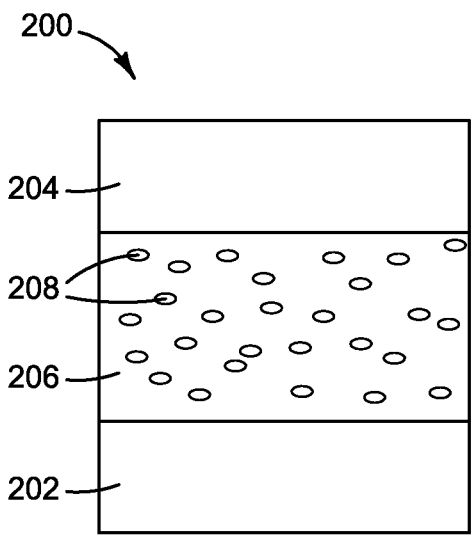
FIGS. 2A-2C are each cross-sectional views of possible initial states, according to an example.
Figure 2B:
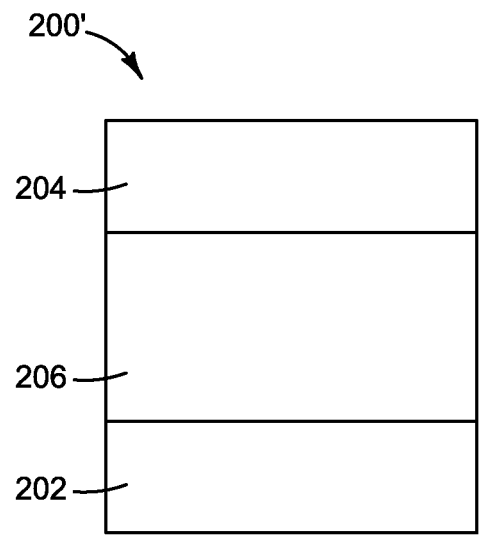
Figure 2C:
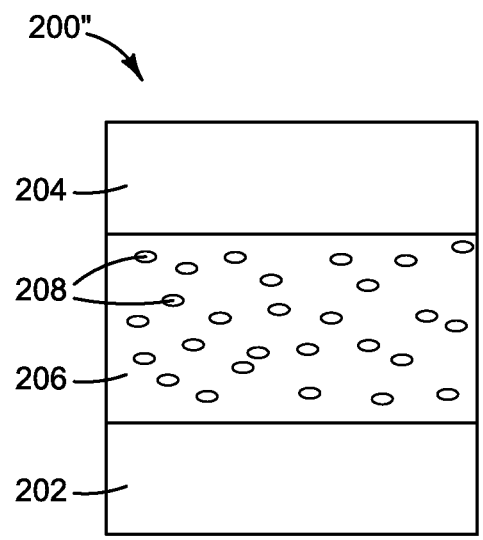

FIGS. 2A-2C show examples of three different initial states. Each memristor 200, 200', 200" may have a bottom electrode 202, a top electrode 204, and an active region 206 sandwiched there between. In FIG. 2A, the bottom electrode 202 may be made of a fast diffusive metal, such as Au, Pt, or Pd. Fast diffusive atoms 208 may be disposed in the active region 206. The fast diffusive atoms 208 may be introduced into the active region 206 during its post-fabrication treatments. The top electrode 204 may be made of a material commonly used in the fabrication of non-volatile devices. Electrodes 202, 204 correspond to electrodes 102, 104, respectively, in FIG. 1.

In FIG. 2B, the bottom electrode 202 may also be made of the fast diffusive metal. Fast diffusive atoms may not be present during the initial fabrication of the device, but may be introduced into the active region 206 during operation of the device 200', such as in an initial treatment post-fabrication. An example of the treatment could be stress the device with appropriate electrical biasing protocols at an elevated temperature. The temperature may be between 150° and 500° C.

In FIG. 2C, the bottom electrode 202 may be made of a metal other than a fast diffusive metal. Fast diffusive atoms 208 may be disposed in the active region 206. The fast diffusive atoms 208 may be introduced into the active region 206 during its post-fabrication treatments.

Bottom electrode 202 may be formed as a layer on a dielectric layer (not shown), defined lithographically, and etched so as to form separate conductor lines, such as conductors 102 in FIG. 1. For the situation where a fast diffusive metal is not used as the bottom electrode, such as illustrated in FIG. 2C, examples of materials for bottom electrodes 202 include, but are not limited to, aluminum (Al), platinum (Pt), tungsten (W), gold (Au), titanium (Ti), ruthenium dioxide ($RuO_2$), titanium nitride (TiN), tungsten nitride ($WN_2$), tantalum (Ta), hafnium nitride (HfN), niobium nitride (NbN), tantalum nitride (TaN), and the like. In any event, the thickness of the electrode 202 may be in the range of about 2 nm to a few micrometers (e.g., about 2 to 3 micrometers). Examples of forming the bottom electrode 202 include, but are not limited to, electroplating, sputtering, evaporation, ALD (atomic layer deposition), co-deposition, chemical vapor deposition, IBAD (ion beam assisted deposition), oxidation of pre-deposited materials, or any other film deposition technology. Methods for defining the bottom electrode 202 lithographically may be conventional. Etching for lithographic definition may be performed by plasma dry etching.

Active layer 206 may be formed over the bottom electrode 202, defined lithographically, and etched. The active layer 206, also called the switching layer, is so called because it supports switching between two (or more) states, "low" resistance and "high" resistance, and thus between "ON" and "OFF", respectively. By "low" and "high" resistance is meant the relative resistance of the active layer 206, where "low" and "high" are relative terms. Typically, the difference in resistance is on the order of at least one order of magnitude, or 10 fold. It is within the active layer 206 that one (or more) conducting channel(s) (not shown in FIGS. 2A-2C, but illustrated in FIG. 4B) may be formed. Examples of suitable materials for forming the active layer 206 include the oxides and nitrides listed above. Examples of forming the active layer 206 include, but are not limited to, e-beam deposition, sputter deposition, atomic layer deposition (ALD), and the like. Methods for defining the active layer 206 lithographically may be conventional. Etching for lithographic definition may be performed by plasma dry etching.

In FIGS. 2A and 2C, the fast diffusive atoms 208 may be added during formation of the active layer 206 by co-depositing, thermal assisted or light assisted diffusion, and the like.

Top electrode 204 may formed over the active layer 206, defined lithographically, and etched. Examples of suitable metals for forming the top electrode 204 are selected from the same list as those used for forming the bottom electrode 202 (other than fast diffusive metals), and may be the same or different. The thickness of the top electrode 204 may be in the same range as for the bottom electrode 202. Examples of forming the top electrode 204 may be the same as those for forming the bottom electrode 202. Methods for defining the top electrode 204 lithographically may be conventional. Etching for lithographic definition may be performed by plasma dry etching.

It may be appreciated that the switching layer is in series with the NDR material containing the fast diffusive metal atoms. There are several other ways to construct this besides what is shown herein. For example, a device (not shown) may have a bottom electrode of gold, a layer of tantalum oxide (in which gold metal atoms either are formed ab initio or are derived from the gold electrode), an intermediate electrode, such as TiN, an active layer of tantalum oxide, and a top electrode of tantalum. There can be many variations on this structure, as well.

Figure 3:
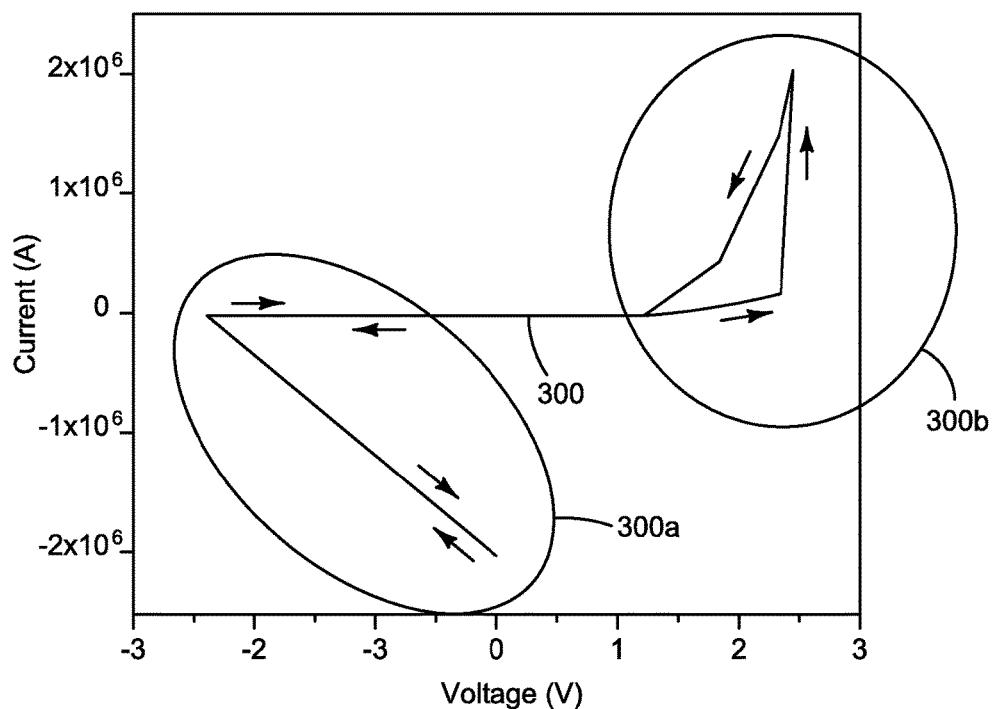
FIG. 3, on coordinates of current (A) and voltage (V), is a plot depicting electrical data, according to an example.

FIG. 3 is an example I-V plot for a memristor having a platinum electrode, a gold electrode, and a $TaO_x$ active region sandwiched therebetween. In this example, the gold electrode provides fast diffusive metal atoms into the $TaO_x$ active region.

Curve 300 is a plot of the current (in A) as a function of voltage (in V). In the right portion 300a of the curve 300, electrical stress assisted by elevated temperature (e.g. 250° C.) preconditions the device by driving the gold atoms into the $TaO_x$ layer. In the left portion 300b of the curve 300, NDR behavior is showing a threshold switching (volatile). The switching is volatile and the device returns to its high resistance state after the applied voltage is removed. The behavior results in a highly nonlinear current-voltage relation, which allows the fast diffusive metal atoms to be used in a selector device in a crossbar array.

FIG. 4A depicts an example of a cross-sectional view of a memristor 400 in an OFF state. FIG. 4B depicts an example of a cross-sectional view of a memristor 400' in an ON state (under electrical bias). In the OFF state, as shown in FIG. 4A, the fast diffusive metal atoms 208 are randomly distributed in the active region 206. The resistance is relatively high compared to the ON state, often at least one order of magnitude higher.

When an electrical bias is provided by a bias source 302, many of the fast diffusive atoms 208 cluster together to form a filament, or channel, 304. The filament 304 may reach from one electrode 202 to the other electrode 204. In some examples, the filament 304 may not physically contact one electrode or the other, but may close enough to permit electron tunneling. In either event, the resistivity of this state may be reduced.

After the electrical bias is removed, the fast diffusive atoms diffuse back to the ground state, i.e., the dispersed distribution. Therefore, the switching is volatile. This threshold switching is driven by electric field rather than current; its energy consumption is lower than that of insulator-metal-transition materials. The latter is driven by Joule heating. The use of fast diffusive metal atoms 208 may reduce sneak path currents in crossbar arrays, as well as providing low switching energy for selectors. Therefore, the fast diffusive metal atoms 208 may also lead to low energy consumption in crossbar arrays used for memory or neuristors.

Figure 5:
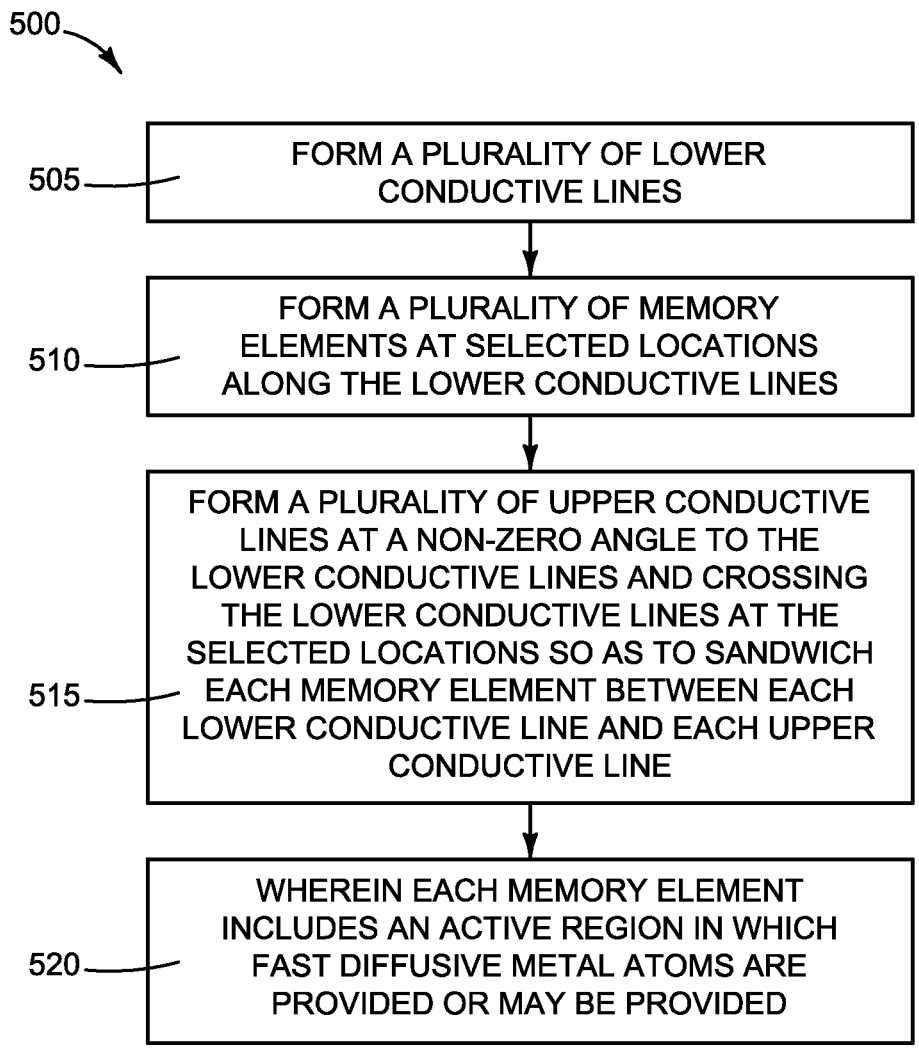
FIG. 5 depicts a process flow chart of a method of reducing sneak path currents in crossbar arrays, according to an example.

FIG. 5 is a process flow chart of a method of reducing sneak path currents in crossbar arrays, according to an example. The process 500 starts with forming 505 a plurality of lower conductive lines 102, 202. The methods used to form the lower conductive lines 102, 202 and their composition are described above.

The process 500 continues with forming 510 a plurality of memory elements 112-118, 200, 200', 200", 400 at selected locations along the lower conductive lines 102, 202. The methods used to form the memory elements 112-118, 200, 200', 200", 400 are described above.

The process 500 concludes with forming 515 a plurality of upper conductive 104, 204 at a non-zero angle to the lower conductive lines 102, 202 and crossing the lower conductive lines at the selected locations so as to sandwich each memory element 112-118, 200, 200', 200", 400 between each lower conductive line and each upper conductive line. The methods used to form the upper conductive lines 104, 204 and their composition are described above.

Each memory element 112-118, 200, 200', 200", 400 includes 520 an active region 206 in which fast diffusive metal atoms 208 are provided or may be provided. The fast diffusive metal atoms may be provided in the active region 206 during its formation or may be provided by an electrode, such as electrode 102, 202, that serves as a source of the fast diffusive metal atoms.

The fast diffusive metal atoms may provide a very large nonlinearity (switching ON/OFF ratio is greater than $10^4$), low operation energy (not Joule heat based), sufficient current density ($>10^6$ A/cm$^2$), low holding voltage to sustain the low resistance state, adjustable threshold voltage (from 0.4 to 3 V), and is a relatively simple structure to manufacture.

What is claimed is:

1. A negative differential resistance (NDR) device for non-volatile memory cells in crossbar arrays in which each non-volatile memory cell is situated at a crosspoint of the array, each non-volatile memory cell comprising a switching layer in series with an NDR material containing fast diffusive atoms that are electrochemically inactive, the switching layer positioned between two electrodes, and one of the electrodes being a source of the fast diffusive atoms.

2. The device of claim 1, in which the switching layer is a memristive switching layer.

3. The device of claim 2, in which the memristive switching layer comprises an intrinsic semiconductor region and a highly doped secondary region.

4. The device of claim 1, in which the fast diffusive metal atoms are selected from the group consisting of gold, platinum, and palladium.

5. The device of claim 1, wherein the NDR material comprises an active region in which the fast diffusive metal atoms form a filament under application of an electric field and disperse when the electric field is discontinued.

6. The device of claim 1, wherein the fast diffusive atoms comprise platinum atoms.

7. The device of claim 1, wherein the fast diffusive atoms comprise palladium atoms.

8. A memory array with negative differential resistance (NDR) switching devices, the memory array including:
    a set of electrically conducting row lines intersecting a set of electrically conducting column lines to form intersections; and
    a memory element disposed at each intersection between one of the row lines and one of the column lines;
    wherein the memory element comprises a switching layer in series with an NDR material containing fast diffusive metal atoms that are not electrochemically active;
    and wherein one of the row lines or column lines is a source of the fast diffusive atoms.

9. The memory array of claim 8, in which the switching layer is a memristive switching layer.

10. The memory array of claim 9, in which the memristive switching layer comprises an intrinsic semiconductor region and a highly doped secondary region.

11. The memory array of claim 8, in which the fast diffusive metal atoms are selected from the group consisting of gold, platinum, and palladium.

12. The memory array of claim 8, wherein the NDR material comprises an active region in which the fast diffusive metal atoms form a filament under application of an electric field and disperse when the electric field is discontinued.

13. A method of reducing sneak path currents in crossbar arrays, comprising:
    forming a plurality of lower conductive lines;
    forming a plurality of memory elements at selected locations along the lower conductive lines; and
    forming a plurality of upper conductive lines at a non-zero angle to the lower conductive lines and crossing the lower conductive lines at the selected locations so as to sandwich each memory element between each lower conductive line and each upper conductive line,
    wherein each memory element includes a negative differential resistance (NDR) device, the NDR device having a switching layer in series with an NDR material, and having an active region in which fast diffusive metal atoms form a filament under application of an electric field and disperse when the electric field is discontinued; and
    wherein one of the lower conductive lines or upper conductive lines is a source of the fast diffusive atoms.

14. The method of claim 13, in which the switching layer is a memristive switching layer.

15. The method of claim 14, in which the memristive switching layer comprises an intrinsic semiconductor region and a highly doped secondary region.

16. The method of claim 13, in which the fast diffusive metal atoms are selected from the group consisting of gold, platinum, and palladium.

17. The method of claim 13, further comprising preventing sneak currents in the crossbar array by using the NDR devices to block sneak current.

\* \* \* \* \*